(12) United States Patent
Buhrer et al.

(10) Patent No.: US 6,544,803 B2
(45) Date of Patent: Apr. 8, 2003

(54) METHOD FOR DETERMINING THE CONCENTRATION OF CONTAMINATION ON A COMPONENT

(75) Inventors: Gayle Buhrer, Meridian, ID (US); Zane L. Drussel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 09/836,826

(22) Filed: Apr. 17, 2001

(65) Prior Publication Data

US 2001/0014485 A1 Aug. 16, 2001

Related U.S. Application Data

(60) Continuation of application No. 09/316,233, filed on May 21, 1999, now Pat. No. 6,242,271, which is a division of application No. 08/979,894, filed on Nov. 26, 1997, now Pat. No. 5,961,722.

(51) Int. Cl.[7] ............................................... G01R 31/26
(52) U.S. Cl. ....................................................... 438/14
(58) Field of Search ......................... 438/14, 16, 460, 438/462, 464, 465, 975; 33/700, 701; 73/864.91

(56) References Cited

U.S. PATENT DOCUMENTS

| 2,424,619 A | | 7/1947 | Keepers |
| 5,249,216 A | | 9/1993 | Ohsugi et al. |
| 5,395,446 A | | 3/1995 | Kageyama et al. |
| 5,686,314 A | | 11/1997 | Miyazaki |
| 5,842,825 A | * | 12/1998 | Brooks ....................... 414/754 |
| 5,882,938 A | * | 3/1999 | Takahashi et al. .......... 436/151 |
| 5,961,722 A | | 10/1999 | Buhrer et al. |

OTHER PUBLICATIONS

C. Neumann and P. Eichinger, Ultra–Trace Analysis of Metallic Contaminations on Silicon Wafer Surfaces by Vapour Phase Decomposition/Total Reflection X–Ray Fluorescene (VPD/TXRF), Spectochimica Acta, vol. 46B, No. 10, 1991.

Diebold, Maillot, Gordon, Baylis, Chacon, Witowski, Arlinghaus Knapp and Doyle, Evaluation of Surface Analysis Methods for Characterization of Trace Metal Surface Contaminants Found in Silicon Integrated Circuit Manufacturing, J. Vac. Sci. Technology, A, vol. 10 No. 4, Jul./Aug. 1992.

* cited by examiner

Primary Examiner—Carl Whitehead, Jr.
Assistant Examiner—David S Blum
(74) Attorney, Agent, or Firm—Kirkpatrick & Lockhart LLP

(57) ABSTRACT

Methods for determining the location of a droplet of water placed on a surface of a semiconductor wafer and for determining the concentration of contamination on a semiconductor wafer surface. One method includes placing a droplet of liquid on the semiconductor wafer surface and generating reference indicia indicative of a location of the droplet on the surface. Another method includes establishing first and second reference axes that intersect at a point and superimposing the point over a droplet of water on the semiconductor wafer surface. A first reference coordinate indicative of the position of the point along the first axis and a second reference coordinate indicative of the position of the point along the second axis are generated.

19 Claims, 4 Drawing Sheets

METHOD FOR DETERMINING THE CONCENTRATION OF CONTAMINATION ON A COMPONENT

CROSS-REFERENCE TO RELATED APPLICATIONS

This application is a continuation of U.S. patent application Ser. No. 09/316,233, filed May 21, 1999, now U.S. Pat. No. 6,242,271, issued Jun. 5, 2001, which is a divisional application of U.S. patent application Ser. No. 08/979,894, filed Nov. 26, 1997, now U.S. Pat. No. 5,961,722, issued Oct. 5, 1999.

FEDERALLY SPONSORED RESEARCH

Not applicable.

BACKGROUND OF THE INVENTION

The subject invention relates generally to locating a reference point and, more particularly, to establishing reference coordinates for the location of a dried droplet of liquid on a semiconductor wafer for assessing the purity of the wafer surface.

Integrated circuits are solid state devices in which electrical components and electrical connections between components are incorporated into a solid matrix by the strategic placement of various conducting, semiconducting and insulating materials. The development of the integrated circuit has led to the miniaturization of electronics by providing a strong matrix to support and protect fragile miniaturized components and connections and by facilitating the placement of the electrical components in close proximity. The integrated circuit has further served to increase the reliability of electronic devices by the elimination of moving parts and fragile electrical wiring and connections.

Integrated circuits are typically mass produced by forming hundreds of circuits called "dice" on a semiconductor substrate known as a "wafer". The circuits are formed by depositing a series of individual layers of predetermined materials on the wafer. The individual layers of the integrated circuit-are produced by a series of manufacturing steps. The precise characteristics of the layers, such as composition, thickness, and surface quality uniquely determine the electronic properties and the performance of the integrated circuit.

Successful fabrication of large scale integrated silicon circuits is dependent upon the purity of the wafer surfaces. The presence of metal contaminates such as iron, nickel, copper and zinc on the semiconductor surfaces can lead to defects during high temperature processing of the wafers because those contaminates can diffuse into the semiconductor material. In an effort to monitor the purity of the semiconductor surfaces, highly sensitive methods for analyzing surface purity have been developed.

One method for determining the concentration of contamination on a silicon wafer is-known as vapor phase decomposition or "VPD". Such method involves supporting the wafer in a specially designed device known as a VPD reactor. A VPD reactor typically contains an acid-resistant beaker and platforms for supporting wafers within a chamber. The wafer platforms are typically water-cooled and the beakers are generally heated by a heat exchanger arrangement integrated into the bottom of the reactor.

After the wafers are placed onto the wafer platform, a solution of hydrofluoric acid is added to a beaker. The hydrofluoric acid is heated within the beaker which causes it to vaporize within the chamber. The acid vapor permeates the chamber and dissolves the silicon oxide surface layer on the wafer. The wafer is cooled by the support platform which causes a thin film of moisture to condense on the wafer surface. The impurities on the surface of the wafer are contained in the moisture film.

The wafer is then removed from the reactor and a predetermined amount of deionized water is then immediately pipetted on to the surface. This droplet is then moved over the entire surface area by gently tilting the wafer. During this process, the impurities are collected in the droplet. The droplet is then moved generally to the center of the wafer and the wafer is placed into a vacuum chamber wherein the droplet is dried on the wafer. After the droplet has been dried, its contents are analyzed by a process known as total reflection X-ray spectrometry ("TXRF"). The principle of TXRF is based on the detection of trace elements on the surface of an optically flat substrate by their characteristic X-rays excited by an incoming X-ray beam in total external reflection geometry. Through use of this process, the presence of iron, nickel, copper and zinc on the wafer surface can be detected.

In the past, the location of the droplet of water on the wafer was approximated. Because the exact location of the droplet was unknown, accurate positioning of the TXRF machine relative to the water droplet was time consuming. Moreover, although some TXRF machines are capable of accepting coordinates of a point of interest relative to the machine head, prior methods lacked the capability of generating such coordinates for use by the X-ray machine.

Thus, there is a need for an apparatus and method for generating reference coordinates for a position on a component such as a wafer that can be used to accurately orient a device such as an X-ray machine relative to the position.

There is a further need for an apparatus having the above-mentioned attributes that is relatively inexpensive to manufacture.

There is yet another need for an apparatus having the above-mentioned attributes that is relatively portable and easy to use.

SUMMARY OF THE INVENTION

In accordance with a particularly preferred form of the present invention, there is provided an apparatus for establishing a reference coordinate for a point on a component. The invention preferably includes a component carriage that has coordinate indicia thereon. A locator plate is movably supported relative to the component support carriage. The locator plate is provided with reference indicia for registration with a point within the carriage and alignment with the coordinate indicia on the component carriage. The invention may further include abase to which the component carriage and locator plate are movably attached.

The present invention provides solutions to the aforementioned problems associated with prior locator methods and apparatuses and, in particular, with those methods and apparatuses employed in connection with the evaluation of surface contaminates on silicon wafers. The subject invention is also relatively inexpensive to manufacture, is easy to use and is portable. Those of ordinary skill in the art will readily appreciate that these and other details, features and advantages will become further apparent as the following detailed description of the preferred embodiments proceeds.

BRIEF DESCRIPTION OF THE DRAWINGS

In the accompanying Figures, there are shown present preferred embodiments of the invention wherein like reference numerals are employed to designate like parts and wherein.

DETAILED DESCRIPTION OF THE PREFERRED EMBODIMENTS

Figure 1:
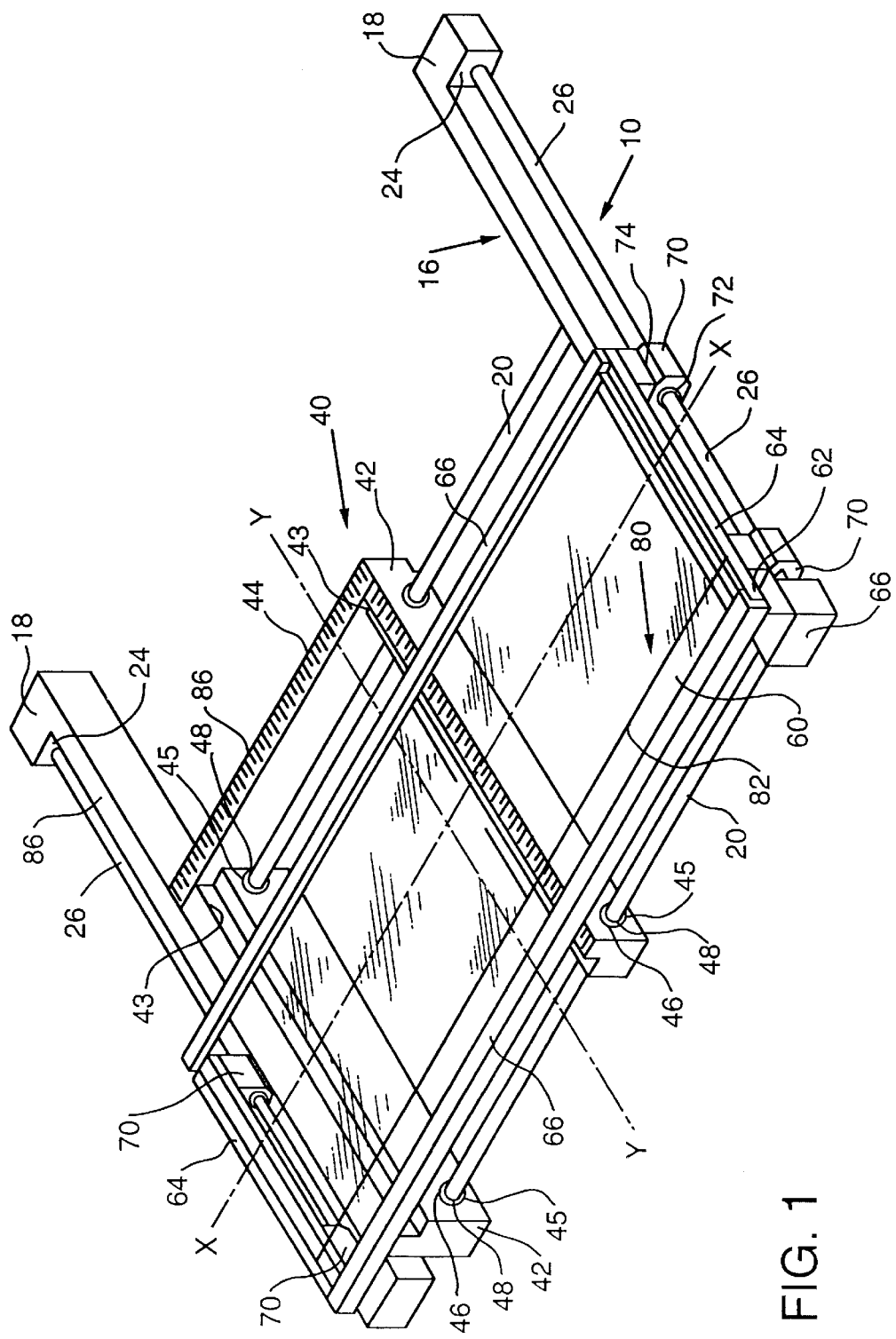
FIG. 1 is an isometric view of a preferred location device of the present invention.

Referring now to the drawings for the purposes of illustrating the present preferred embodiments of the invention only and not for the purposes of limiting the same, FIGS. 1–4 show a preferred location device 10 for supporting a component such as a silicon wafer 12 thereon. Although the subject invention is particularly well-suited for use in connection with silicon semiconductor wafers, the skilled artisan will readily appreciate that the subject invention could be easily adapted for use in connection with a variety of other types of articles and components without departing from the spirit and scope of the present invention.

Figure 2:
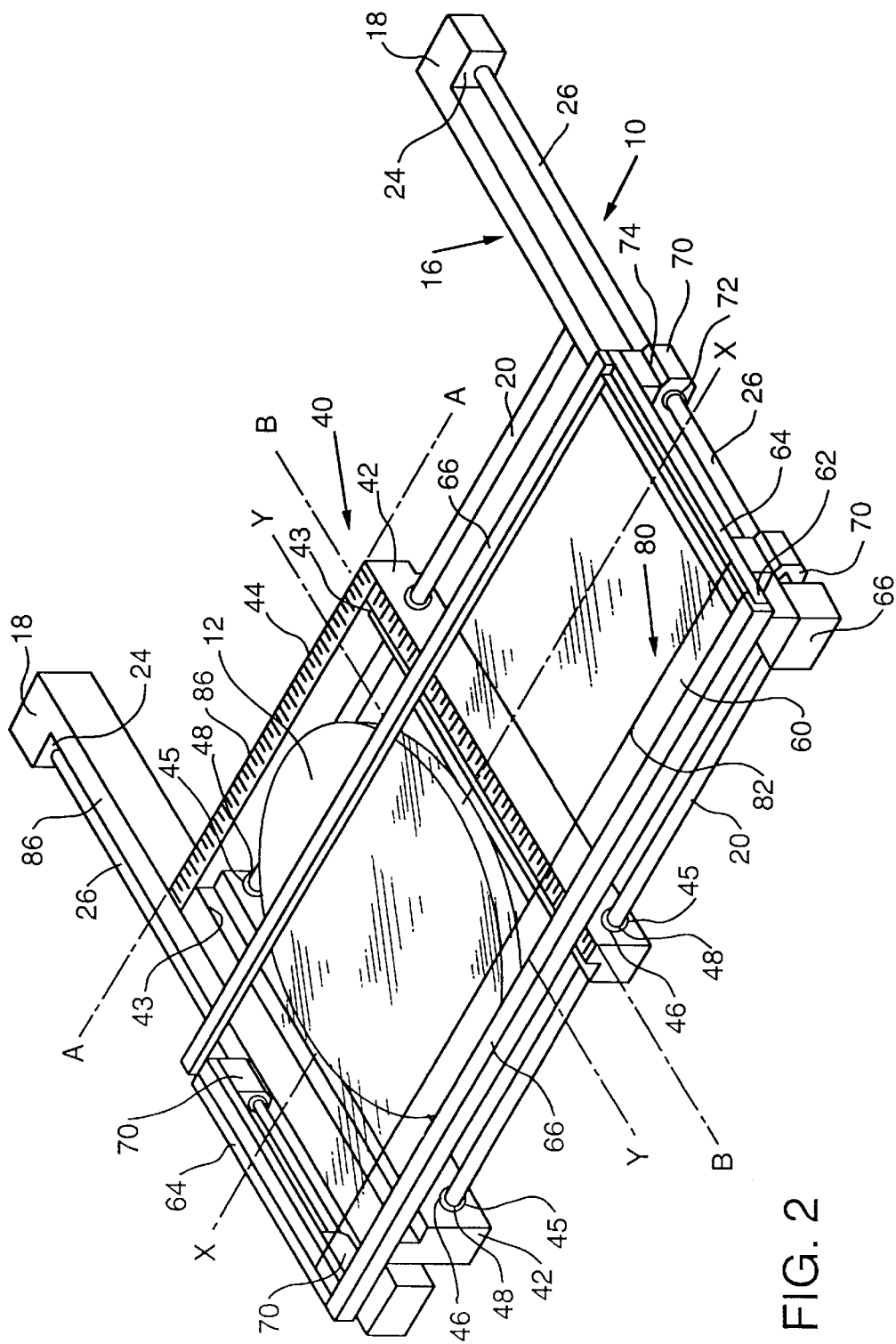
FIG. 2 is an isometric view of the location device of FIG. 1, supporting a silicon wafer thereon.
Figure 3:
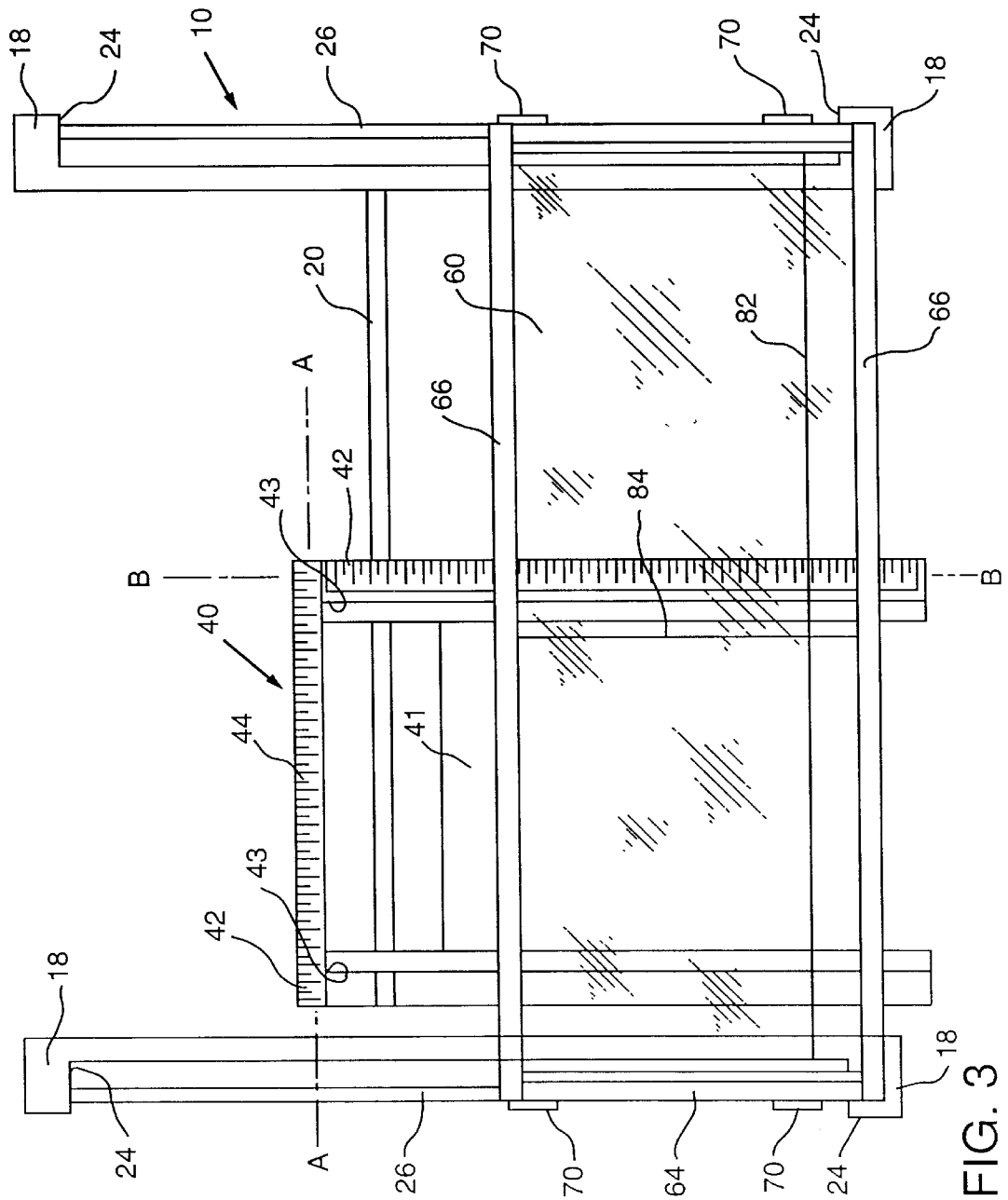
FIG. 3 is a plan view of the location device of FIG. 2.
Figure 4:
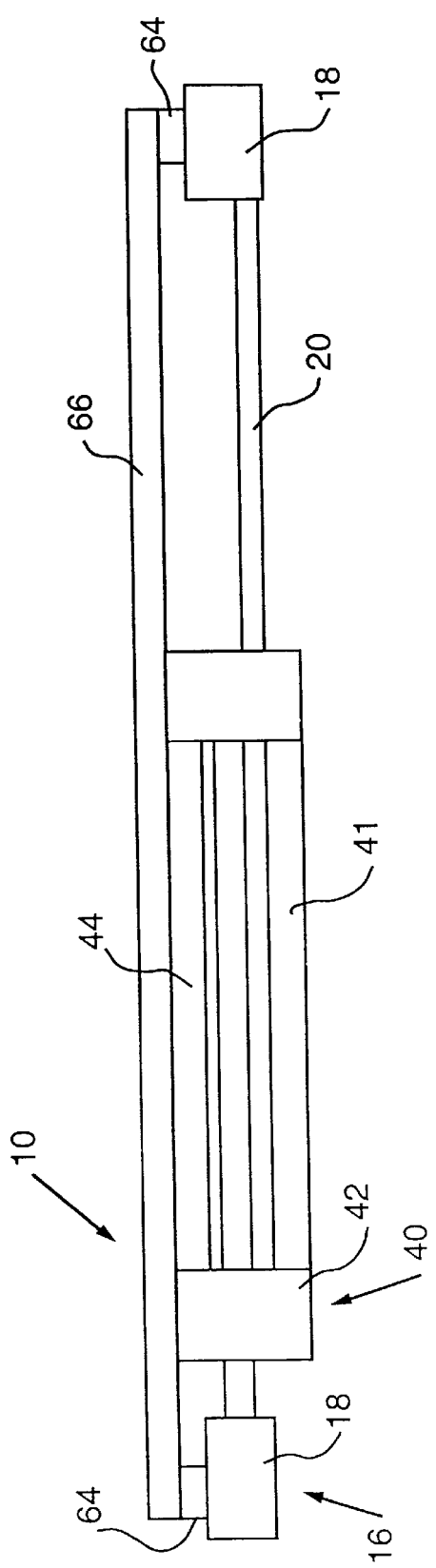
FIG. 4 is a side elevational view of the location device depicted in FIGS. 2 and 3.

As can be seen in FIGS. 1 and 2, the location device 10 preferably comprises a base 16 that movably supports a component or wafer carriage 40 and a transparent's locator plate. 60. In a preferred form, the base 16 includes two side members 18 fabricated from stainless steel or other suitable material. A pair of spaced rods 20 are attached to the side members 18 and extend therebetween. As will be discussed in further detail below, rods 20 define a first plane along which the component carriage 40 can be selectively positioned. The linear directions in which the component carriage 40 can move within the first plane are defined by a first linear axis "X—X".

Each side member 18 has a longitudinally extending notch 24 for receiving a corresponding lateral rod 26. Lateral rods 26 serve to movably support the locator plate 60 along a second plane that is preferably above and parallel to the first plane. The directions in which the locator plate 60 can move within the second plane are defined by a second linear axis "Y—Y" that is perpendicular to the "X—X" axis, in a manner that will be discussed in further detail below.

Component carriage 40, in a preferred form, comprises a base plate 41, two side members 42 and an end member 44. The base plate 41 and end member 44 are preferably attached to the side members 42 by screws such that the side members 42 are supported in spaced relation to each other. In this embodiment, the side members 42 are notched to laterally support a component such as a silicon wafer 12 thereon. See FIG. 2. In a preferred embodiment, commercially available bearings are installed in corresponding bores 45 provided through the side members 42 as shown in FIGS. 1 and 2. The skilled artisan will appreciate that the bearings 46 have a bore 48 therethrough for slidably receiving a corresponding rod to slidably support the component carriage 40 between the side members 18.

Also in a preferred embodiment, a support frame assembly 62 is provided to movably support the transparent locator plate 60 on the base 16. Preferably, locator plate 60 is fabricated from tempered glass. However, other transparent material could be successfully employed.

Frame assembly 62 preferably comprises a pair of end members 64 and a pair of side members 66 that are interconnected by screws (not shown) in a shape that is complementary to the shape of the locator plate 60. The side members 66 are preferably "L"-shaped for receiving a corresponding edge of the locator plate 60 as shown in FIGS. 1 and 2. Attached to each corner of the frame assembly 62 are bearing blocks 70. Each bearing block 70 is preferably fabricated from stainless steel or other suitable material and has a bearing 72 installed therein. Each bearing 72 has a bore 74 for slidably receiving a corresponding rod 26 therethrough. Those of ordinary skill in the art will appreciate that the bearing blocks 70, in cooperation with the rods 26 serve to movably support the frame assembly 62 and locator plate 60 for selective travel along axis "Y—Y". Referencing indicia 80, preferably in the form of crossed lines (82, 84) is provided on the locator plate 60 which can be used to reference a specific point or location on the wafer. Reference scales 86 containing coordinate indicia 81 (preferably numerical in nature) are also preferably attached to at least one side member 42 and the end member 44 of the component carriage 40. Such referencing coordinate indicia 81 are arranged on the end member 44 and the side member 42 to lie along intersecting axes "A—A" and "B—B", respectively. See FIGS. 2 and 3.

Use of the subject invention 10 in connection with locating a specific reference point such as the location of a water droplet on a wafer 12 will now be described. After the water droplet has been dried on the wafer 12, the wafer 12 is placed onto the wafer carriage 40 of the subject invention. The carriage 40 and/or the locator plate 60 are moved as necessary along the "X—X" and "Y—Y" axes, respectively to bring the point where the lines (82, 84) cross into registration with the water droplet. After the point where the crossed lines (82, 84) intersect is brought into registration with the water droplet, X and Y coordinates for the droplet location are established wherein the reference lines (82, 84) intersect the coordinate indicia on the scales mounted to the side member 42 and end member 44 of the component carriage 40.

Those of ordinary skill in the art will appreciate that such coordinates can be used in conjunction with known control systems to locate a piece of equipment, such as an X-ray machine relative to the water droplet. The skilled artisan will further appreciate that the positioning of the component carriage 40 and the locator plate 60 relative to the base structure 16 can be automatically established by utilizing, for example, by positioning apparatuses such as lead screws/ball screws and stepper motor arrangements. Also, commercially available sensor arrangements could be employed to detect the final position of the carriage, the locator plate and referencing indicia thereon and such data could be incorporated into a control system for controlling the position of other machinery components relative thereto.

Thus, from the foregoing discussion, it is apparent that the present invention provides significant improvements over prior methods for locating a point of interest on a component such as a silicon wafer. The subject invention also provides the advantages of being readily portable and easy to use and cost-effective to manufacture. Those of ordinary skill in the art will appreciate that various changes in the details, materials and arrangement of parts which have been herein described and illustrated in order to explain the nature of the invention may be made by the skilled artisan within the principle and scope of the invention as expressed in the appended claims.

What is claimed is:

1. A method for determining the concentration of contamination on a semiconductor wafer surface, comprising:

forming a contamination-collecting droplet of liquid on the semiconductor wafer surface;

generating reference indicia indicative of a location of the droplet of liquid on the semiconductor wafer surface;

directing a contamination analyzer to the location of the droplet; and detecting the concentration of contaminants in the droplet with the contamination analyzer.

2. The method of claim 1 wherein said generating reference indicia comprises generating a reference coordinate corresponding to a location of the droplet along a first axis.

3. The method of claim 2 wherein said generating reference indicia comprises generating another reference coordinate corresponding to a location of a droplet along a second axis.

4. The method of claim 3 wherein the second axis intersects the first axis.

5. The method of claim 2 wherein said generating a reference coordinate comprises superimposing the first axis over the droplet and assigning a coordinate indicative of the location of the droplet along the first axis.

6. The method of claim 3 wherein said generating a reference coordinate further comprises superimposing the second axis over the droplet and assigning a second coordinate indicate of the location of the droplet along the second axis.

7. A method for determining the concentration of contamination on a semiconductor wafer surface, comprising:

collecting impurities in a moisture film on the semiconductor wafer surface;

placing a droplet of liquid on the semiconductor wafer surface;

drying the droplet of liquid on the semiconductor wafer surface;

generating reference coordinates for the dried droplet of water indicative of a location of the dried droplet of water on the semiconductor wafer surface:

directing a contamination analyzer to the location of the droplet; and detecting the concentration of contaminants in the droplet with the contamination analyzer.

8. The method of claim 7 wherein said collecting comprises:

dissolving a silicone oxide layer on the semiconductor wafer surface; and condensing the moisture film on the semiconductor wafer surface.

9. The method of claim 8 wherein said dissolving, comprises:

placing the semiconductor wafer into a chamber; and vaporizing hydrofluoric acid within the chamber.

10. The method of claim 8 wherein said collecting further comprises cooling the wafer within the chamber.

11. The method of claim 7 further comprising moving the droplet over the semiconductor wafer surface.

12. The method of claim 11 wherein said moving comprises tilting the semiconductor wafer.

13. The method of claim 7 wherein said drying comprises:

placing the semiconductor wafer into a vacuum chamber; and operating the vacuum chamber.

14. A method for determining the concentration of contamination on a semiconductor wafer surface, comprising:

supporting the semiconductor wafer within a chamber;

vaporizing an acid within the chamber;

cooling the semiconductor wafer;

removing the semiconductor wafer from the chamber;

placing a droplet of liquid onto the semiconductor wafer surface;

moving the droplet on the semiconductor wafer surface;

placing the semiconductor wafer into a vacuum chamber;

operating the vacuum chamber to dry the droplet of liquid at a location on the semiconductor wafer surface;

generating reference indicia for the dried droplet of water indicative of the location of the dried droplet of water on the semiconductor wafer surface;

directing a contamination analyzer to the location of the droplet; and detecting the concentration of contaminants in the droplet with the contamination analyzer.

15. The method of claim 14 wherein said generating reference indicia comprises generating a reference coordinate corresponding to a location of the droplet along a first axis.

16. The method of claim 15 wherein said generating reference indicia comprises generating another reference coordinate corresponding to a location of a droplet along a second axis.

17. The method of claim 16 wherein the second axis intersects the first axis.

18. The method of claim 15 wherein said generating a reference coordinate comprises superimposing the first axis over the droplet and assigning a coordinate indicative of the location of the droplet along the first axis.

19. The method of claim 16 wherein said generating a reference coordinate further comprises superimposing the second axis over the droplet and assigning a second coordinate indicate of the location of the droplet along the second axis.

* * * * *

UNITED STATES PATENT AND TRADEMARK OFFICE
CERTIFICATE OF CORRECTION

PATENT NO.         : 6,544,803 B2
APPLICATION NO. : 09/836826
DATED              : April 8, 2003
INVENTOR(S)        : Gayle Buhrer and Zane L. Drussel It is certified that error appears in the above-identified patent and that said Letters Patent is hereby corrected as shown below:

Col. 1, line 41, delete "circuit-are" and substitute therefor --circuit are--

Col. 1, line 56, delete "is-known" and substitute therefor --is known--

Col. 2, line 50, delete "abase" and substitute therefor --a base--

Col. 3, line 12, delete "for,the" and substitute therefor --for the--

Col. 3, line 24, delete "abase" and substitute therefor --a base--

Col. 3, line 25, delete "transparent's" and substitute therefor --transparent--

Col. 3, line 26, delete "plate." and substitute therefor --plate--

Col. 3, line 42, delete "axis," and substitute therefor --axis--

Signed and Sealed this

Twenty-fourth Day of July, 2007

JON W. DUDAS
*Director of the United States Patent and Trademark Office*